(12) United States Patent
Petersen

(10) Patent No.: US 7,286,578 B2
(45) Date of Patent: Oct. 23, 2007

(54) HIGH-POWER DIODE LASER SYSTEM

(75) Inventor: Paul Michael Petersen, Hillerød (DK)

(73) Assignee: Danmarks Tekniske Universitet, Lyngby (DK)

( * ) Notice: Subject to any disclaimer, the term of this patent is extended or adjusted under 35 U.S.C. 154(b) by 271 days.

(21) Appl. No.: 10/503,487

(22) PCT Filed: Mar. 3, 2003

(86) PCT No.: PCT/DK03/00132

§ 371 (c)(1),
(2), (4) Date: Feb. 22, 2005

(87) PCT Pub. No.: WO03/075419

PCT Pub. Date: Sep. 12, 2003

(65) Prior Publication Data

US 2005/0163186 A1 Jul. 28, 2005

(30) Foreign Application Priority Data

Mar. 4, 2002 (DK) .............................. 2002 00328

(51) Int. Cl.
*H01S 3/098* (2006.01)
*H01S 3/08* (2006.01)

(52) U.S. Cl. .......................................... 372/19; 372/99
(58) Field of Classification Search .................. 372/19, 372/50, 22, 99, 102
See application file for complete search history.

(56) References Cited

U.S. PATENT DOCUMENTS

| 5,022,034 A | 6/1991 | May et al. |
| 2001/0035995 A1 | 11/2001 | Ruggeiro |

FOREIGN PATENT DOCUMENTS

| EP | 0 843 391 A1 | 5/1998 |
| JP | 05206579 A | 8/1993 |
| WO | WO 00/25396 | 5/2000 |
| WO | WO 00/72409 A2 | 11/2000 |

OTHER PUBLICATIONS

XP-002230391, Gerald Roosen et al., "Adaptive shaping and filtering of laser beams using photorefractive elements."

(Continued)

*Primary Examiner*—Armando Rodriguez
(74) *Attorney, Agent, or Firm*—Finnegan, Henderson, Farabow, Garrett, & Dunner L.L.P.

(57) ABSTRACT

A diode laser system having a diode amplifier member with a large transverse gain area. The diode amplifier member includes an amplifying medium for amplifying a number of spatial modes of a spatial light distribution. The laser system further includes a number of passive reflective members forming a laser cavity which includes at least a part of the diode amplifier member, each of the passive reflective members being adapted, during operation, to reflect light at least partially into the amplifying medium. The passive reflective members are adapted, during operation, to induce, via the light reflected by them, a self-induced dynamic gain and refractive index grating in the diode amplifier member, the dynamic gain and refractive index grating selecting one of said spatial modes and suppressing at least a part of the remaining spatial modes of the spatial light distribution.

23 Claims, 8 Drawing Sheets

OTHER PUBLICATIONS

XP 000694854, Peter P. Vasil'ev et al., "Phase-conjugation broad area twin-contact semiconductor laser," Appl. Left. 71(1), Jul. 7, 1997.

XP-000710524, W.B. Whitten et al., "Mode selection in a continuous-wave dye laser with an intracavity Photorefractive element," Optics Letters, vol. 12, No. 2, Feb. 1987.

XP-000799012, Robert J. Lang et al., "Theory of Grating-Confined Broad-Area Lasers," IEEE Journal of Quantum Electronics, vol. 34. No. 11, Nov. 1998.

XP-000845966, B. Pezeshki et al., "400-mW Single-Frequency 660-nm Semiconductor Laser," IEEE Photonics Technology Letters, vol. 11, No. 7, Jul. 1999.

C. Chang-Hasnain, et al., "Diffraction-limited emission from a diode laser array in an apertured graded-index lens external cavity," Appl. Phys. Lett. 49 (11, Sep. 15, 1986.

W.. Kozlovsky, et al., "Blue light generation by resonator-enhanced frequency doubling of an extended-cavity diode laser," Appl. Phys. Lett. 65 (5), Aug. 1, 1994.

Peter Kürz et al., "Highly efficient phase conjugation using spatially nondegenerate four-wave mixing in a broad-area laser diode," Appl. Phys. Lett 68 (9), Feb. 26, 1996.

H. Shi et al., Demonstration of phase correlation in multiwavelength mode-locked semiconductor diode lasers, Optics Letters, vol. 24, No. 4, Feb. 15, 1999.

HIGH-POWER DIODE LASER SYSTEM

BACKGROUND OF THE INVENTION

This invention relates to a diode laser system and, more particularly, a high power diode laser system.

Laser diodes are well known as reasonably priced, small and robust sources of laser beams. Conventional laser diodes with small output power and good coherence properties have been available, and they are used in many applications such as CD players, bar-code readers etc.

More recently, laser diodes with several Watts of output power have become available. These high-power laser diodes are potentially applicable in industrial areas requiring high power light sources, such as in printing, material processing, medicine, optical sensors and pumping of high-power single mode active waveguides. However, as the optical quality of these lasers is not sufficiently good for many of these applications, it has been a long felt need to improve the optical quality of high-power laser diodes. FIGS. 1a-b schematically illustrate such a broad area laser comprising a semiconductor diode 100 with a p-n junction 101 which provides an amplifying medium when a pump current is applied to the junction via electrodes 108 and 109. In a conventional laser diode, two opposing end facets 102 and 103 are coated with a reflecting coating, thereby generating a laser cavity between them. If one of the end facets 103 is totally reflecting and the other end facet 102 has a low reflectivity, typically in the range 4-8%, a laser beam with an angular distribution around the optical axis 104 is emitted. GaAlAs semiconductor broad-area laser diode arrays are attractive, because they can be operated with a low voltage and because they have a lifetime of more than 20.000 hours. The optical output power of these diodes is related to the dimensions of the light emitting output facet, in particular of the area 105 of the light emitting region which will be referred to as transverse gain area. Commercially available broad area lasers have light-emitting areas of a few micrometers in the direction 106 across the active region, e.g. 1-2 µm. In the lateral direction 107 along the active region, the so-called stripe width may be varied. By increasing the stripe width of the output facet the output power has increased significantly during the last 10 years. Broad-area lasers with 200 µm stripe width are now commercially available with an output power of up to 4 W. However, it is a problem of these lasers that the dimensions of the output facet may not be increased arbitrarily, since an increase of the stripe width causes undesired side effects which decrease the quality of the laser diode. These side effects include filamentation/self-focussing, thermal rollover, low power- and frequency stability, and poor spatial and temporal coherence. Filamentation or self-focussing inside the active semiconductor material causes very poor spatial beam quality of conventional broad area diodes. Filamentation is caused by high intensity spatial regions, so-called hot spots, which are formed inside the laser cavity due to the nonlinear optical interaction between the semiconductor material and the laser beam. These localized hot spots are formed in unpredictable patterns causing unpredictable phase modulations of the laser light, thereby severely reducing the quality of the laser field profile. The term thermal rollover refers to the problem that the optical output power from broad area lasers is limited by the so-called catastrophic facet damage caused by thermal runaway and melting of the cleaved laser mirror. Power and frequency instabilities occur if the intensity is above a critical intensity.

Attempts have been made to improve the quality of the output beams of broad-area diodes, e.g. by providing external feedback from an external cavity (see e.g. C. Chang-Hasnain, D. F. Welch, D. R. Scifres, J. R. Whinnery, A Dienes, and R. D. Burnham, "Diffraction-limited emission from a diode laser array in an apertured graded-index external cavity," Appl. Phys. Lett. 49, 614-616 (1986)). However, in general, diode lasers with feedback are very sensitive to vibrations in the external mirror and therefore the external cavity must be stabilized. Furthermore, bifurcations and chaotic behaviour may take place in the output beam of feedback diode lasers if the amount of feedback is above a critical value.

The light emitted by conventional broad area lasers comprises a number of spatial modes, where each mode corresponds to a respective angle of emission. The lowest order mode, the so-called fundamental mode, is emitted in the direction of the optical axis 104, while the higher-order modes are emitted as a twin-lobe intensity distribution along the so-called low-coherence axis, i.e. the x-axis in FIGS. 1a-b. The lobes of any given higher-order mode are emitted at corresponding angles on respective sides of the optical axis. The above mode structure influences the coherence properties of the emitted laser beam. In particular, when operated high above threshold, broad area lasers oscillate in a high number of spatial modes with each mode radiated in different directions. Consequently, the spatial coherence is rather poor. High power broad area lasers oscillate in many longitudinal modes and the temporal coherence of the laser is very low, typically some hundred microns. The low-coherence axis is also referred to as slow axis, while the axis perpendicular to the slow axis, i.e. the y-axis in FIGS. 1a-b is referred to as the fast axis.

If the stripe width of a broad area laser is increased beyond 200 µm, the degradation of the laser light due to the above side effects overcompensate for the increase in output power and the properties of the output beam become very poor. In particular, laser diodes with large light light-emitting areas have poor spatial coherence properties in the lateral direction of the light-emitting aperture, the so-called low-coherency axis. Due to this disadvantage, the resulting light beam cannot be focused to a small spot size over long distances. A measure of quality used to estimate the spatial coherence of laser sources is the so-called $M^2$ value. The $M^2$ value is related to a light source's ability to be focused.

Robert J. Lang, K. Dzurko, Amos A. Hardy, Scott Demard, Alexander Schoenfelder, and David F. Welch, "Theory of Grating-Confined Broad-Area Lasers" (IEEE Journal of Quantum Electronics, Vol. 34, No. 11, November 1998, p. 2196-2210) describe a so-called angled-grating distributed feedback laser ($\alpha$-DFB) which comprises a broad-area gain-stripe with a permanently embedded grating parallel to the gain stripe such that the stripe and the grating are disoriented from the cleaved facets by a substantial angle. The described $\alpha$-DFB supplies both feedback and selective spatial filtering, enforcing single-spatial mode oscillation.

However, it is a disadvantage of the above prior art system that it is difficult and cost-intensive to fabricate laser diodes with embedded gratings. It is a further disadvantage of this system that thermal effects influence the alignment of the laser and therefore it does not lead to stable long term operation.

SUMMARY OF THE INVENTION

The above and other problems are solved by a diode laser system comprising

- a diode amplifier including an amplifying medium for amplifying a number of spatial modes of a spatial light distribution; and
- a number of passive reflective members forming a laser cavity including at least a part of the amplifying medium, each of the passive reflective members being adapted, during operation, to reflect light at least partially into the amplifying medium;

wherein at least a first and a second one of the number of passive reflective members are non-parallel to each other causing at least respective first and second light beams to propagate in corresponding first and second directions through the amplifying medium, the first and second directions defining a predetermined angle between them and causing the first and second light beams to induce, during operation, a dynamic gain and refractive index grating in the amplifying medium;

and wherein the predetermined angle is selected large enough to cause the dynamic gain and refractive index grating to selectively diffract one of said spatial modes and suppressing at least a part of the remaining spatial modes of said spatial light distribution; and wherein the predetermined angle is selected small enough to cause the dynamic gain and refractive index grating to have a fringe spacing larger than the characteristic diffusion length of the amplifying medium.

The induced dynamic grating in the amplifying medium is caused by periodic variations of the gain and refractive index in the medium due to periodic variations of the charge carrier density. These variations are induced due to the interference of the laser beams in the amplifying medium. As a result of this dynamic grating, the laser beams are diffracted inside the semiconductor, depending upon their orientation relative to the grating. Hence, a preferred direction of propagation is introduced, a so-called waveguide effect, thereby eliminating the detrimental effect of filamentation. This is due to the fact that the nonlinearity introduced by the induced grating is dominating the self-focusing nonlinearity causing the filamentation. Consequently, according to the invention, the quality of a conventional broad-area laser diode is significantly improved, thereby providing a cost-effective, high power laser system with very good beam properties.

The predetermined angle is selected large enough to cause the dynamic gain and refractive index grating to selectively diffract one of said spatial modes and suppressing at least a part of the remaining spatial modes of said spatial light distribution. Due to the angle- and wavelength selectivity of the induced dynamic grating, an output beam with high spatial and temporal coherence is produced, even without spatial and temporal filters, since the induced grating is automatically optimised to have high diffraction efficiency and selectivity for one mode due to feedback from the mirrors. All other modes are suppressed by the induced grating.

When the amplifying medium has a predetermined refractive index n, the laser light has a predetermined vacuum wavelength $\lambda$, and the diode amplifier comprises two end facets on opposite sides of the diode amplifier, the end facets being spaced apart by a distance L; and said angle is selected to be larger than a minimum angle $\theta_{crit}$ determined according to $$\theta_{crit} = \sqrt{\frac{2n\lambda}{L}},$$

the induced grating is particularly selective, since the induced grating efficiently suppresses different axial modes, thereby selectively diffracting a beam incident at the Bragg angle.

Furthermore, the predetermined angle is selected such that the corresponding fringe spacing is larger than the characteristic diffusion length of the amplifying medium. When the fringe spacing is larger than the characteristic diffusion length of the amplifying medium, a strong grating is built up in the amplifying medium, i.e. a grating with a large amplitude. Preferably, the angle is selected as to maximize the amplitude of the dynamic grating. In one embodiment, the amplifying medium has a predetermined carrier lifetime and a predetermined ambipolar diffusivity, and the laser light has a predetermined vacuum wavelength; and the angle is selected to be smaller than a maximum angle given by said vacuum wavelength divided by $2\pi$ times the square root of the predetermined carrier lifetime times the ambipolar diffusivity, thereby avoiding a washout of the induced grating due to carrier recombination and diffusion.

It is an advantage of the invention that the intensity at the facet of the laser diode is reduced by using wider stripes and by a uniform intensity distribution across the facet, thereby reducing the risk of thermal roll-over.

Furthermore, as the oscillation frequency is independent of the cavity length, compact laser systems with short cavities which are robust against vibrations and temperature variations may be produced.

It is a further advantage of the invention that, due to the laser induced grating in the active medium, only one of the spatial modes is selected, i.e. a spatial mode for which the Bragg condition is fulfilled, and, at the same time, the other modes are effectively suppressed. This leads to a significant improvement of the spatial coherence of the laser system.

Furthermore, the dynamic grating may further select one or more temporal modes.

Furthermore, the signal-to-noise ratio is improved, as noise due to other modes is suppressed by the dynamically induced grating.

It is still a further advantage of the invention that, in contrast to the permanent gratings of the prior art, the dynamic gratings automatically adapt to small changes, thereby optimizing the diffraction process at all times. Consequently, a laser system with a high long-term stability is provided.

It is still a further advantage of the invention that it provides a laser system which may be produced at low cost.

It is yet a further advantage of the invention that, due to the induced grating, a narrow frequency spectrum, e.g. one longitudinal mode, may be selected by the grating, thereby significantly increasing the coherence length of the emitted laser beam.

It is yet another advantage of the invention that it utilises passive reflective members, thereby providing a self-induced gain and refractive index grating which does not require any external pump lasers. Consequently, the invention allows for a simple and compact implementation of high power lasers providing high quality output beams. Furthermore, the invention allows the construction of inexpensive lasers.

The diode amplifier may comprise any suitable material providing an amplifying medium for laser light having a large transverse gain area, i.e. a large light emitting area, which is larger than that of a typical single mode laser, i.e. larger than 3-5 µm. Examples of such diode amplifiers comprise broad-area amplifiers such as broad-area laser diodes, preferably with large stripe width. Examples of semiconductor diode materials which may be used as amplifying medium include but are not restricted to InGaAlP lasing in the region 630-690 nm, GaAlAs lasing in the region 780-870 nm, InGaAs lasing in the region 900-1020 nm, and InGaAsP lasing in the region 1500-2100 nm.

Hence, according to the invention, a high power laser system with high spatial and temporal coherence is provided, even for stripe widths larger than 200 µm. Accordingly, in a preferred embodiment of the invention, the width of the transverse gain area is larger than 200 µm, even more preferably larger than 300 µm, most preferably larger than 500 µm, thereby obtaining a high output power since the overall output power may be increased without increasing the intensity at the facet. For example, the stripe width may be chosen to be between 300 µm and 2000 µm or even larger. In one embodiment the stripe width is between 1000 µm and 1500 µm.

In a preferred embodiment, the amplifying medium has a predetermined refractive index, the laser light has a predetermined vacuum wavelength, the induced gain and refractive index grating has a predetermined fringe spacing, and the diode amplifier comprises two end facets on opposite sides of the diode amplifier, the end facets being spaced apart by a distance which is larger than said refractive index times said fringe spacing squared and divided by said vacuum wavelength, preferably larger than twice said refractive index times said fringe spacing squared and divided by said vacuum wavelength. When the length of the amplifying medium, i.e. the distance between the end facets of the laser diode, is sufficiently long, the induced grating provides a particularly effective suppression of undesired spatial modes, i.e. an efficient selection of a single spatial mode.

In another preferred embodiment of the invention, the passive reflective members cause a first and a second pair of counter-propagating light beams, the first pair of light beams propagating inside the amplifying medium along a first direction, and the second pair of light beams propagating inside the amplifying medium along a second direction having a predetermined angle relative to the first direction; the first and second pairs of light beams inducing the gain and refractive index grating by a four wave mixing process. Consequently, the gain and refractive index grating is induced by a four-wave mixing process providing an efficient generation of a strong dynamic grating. In this process, the grating is induced by a non-linear interaction of four light beams in the amplifying medium. The fringe spacing of the induced grating is determined by the angle between the interacting light beams.

Preferably, the diode amplifier comprises a GaAlAs laser diode with end facets being spaced apart by a distance between 0.5 mm and 4 mm, e.g. between 2 and 3 mm, and corresponding to a wavelength of 810 nm; and the angle is selected to be between 1 and 10 degrees, preferably between 4 and 7 degrees, most preferably between 4.2 and 6.5 degrees. Many commercially available laser diodes have a longitudinal dimension, i.e. in the direction of the emitted laser beam, of 1 mm or 2 mm. However, according to the invention, thicker laser diodes, e.g. with a longitudinal dimension of 5 mm or even larger, may be used, thereby increasing the efficiency of the mode suppression.

In another preferred embodiment of the invention, at least a first one of said number of reflective members is positioned outside the amplifier member; and the laser system further comprises a spatial filter positioned between the first reflective member and the amplifier member. Preferably, the spatial filter is adapted to suppress a part of the spatial modes of a corresponding one of the light beams of the first and second pairs of light beams. Consequently, the spatial filter may be adapted to more efficiently select a single spatial mode, thereby further improving the quality of the output beam. In a further preferred embodiment of the invention, at least a first one of said number of reflective members is positioned outside the amplifier member; and the laser system further comprises a frequency filter positioned between the first reflective member and the amplifier member, the frequency filter reducing the spectral bandwidth of a corresponding one of the light beams of the first and second pairs of light beams, thereby increasing the efficiency of the four-wave mixing process.

In another preferred embodiment of the invention, at least one of the passive reflective members is a permanent grating embedded in the diode amplifier. The grating may be produced by any known technique, such as electron beam lithography, UV-induced holography, etching, or the use of photoresists. It is an advantage of this embodiment that it provides a very compact laser system, where all components are embedded in a single broad-area diode. Furthermore, in this embodiment, no external components, such as external lenses, mirrors, filters, or the like need to be aligned, thereby providing a laser system which is very suitable for mass production. In the following, this embodiment will be referred to as monolithic configuration.

According to another preferred embodiment of the invention, the diode amplifier comprises a front facet and a rear facet on opposite sides of the diode amplifier, each of the facets being coated with an antireflection coating;

a first and a second one of the reflective members are positioned on opposite sides of the amplifying medium corresponding to the rear and front facets, the first and second reflective members forming the laser cavity and generating a first pair of counter-propagating light beams; and a third one of the reflective members is positioned on one side of the amplifying medium corresponding to the front facet, the third reflective member causing one of a second pair of counter-propagating light beams to be reflected back into the amplifying medium, the second pair of counter-propagating light beams propagating at a predetermined incident angle relative to the front and rear facets outside the amplifier member.

It is an advantage of this embodiment that the two pump beams, i.e. the first pair of counter-propagating beams, are strong and of substantially equal magnitude, thereby providing a particularly efficient four-wave mixing process.

Preferably, the antireflection coating provides a reflectivity of less than 10%, more preferably less than 4%, more preferably less than 1%, most preferably less than 0.5%.

According to another preferred embodiment of the invention, the diode amplifier comprises a front facet and a rear facet on opposite sides of the diode amplifier, the front facet being coated with a low-reflectivity coating;

a first one of the reflective members is positioned on one side of the amplifying medium corresponding to the front facet, the first reflective member causing one of a first pair of counter-propagating light beams to be reflected back into the amplifying medium at a predetermined incident angle relative to the front and rear facets;

a second one of the number of reflective members is the rear facet of the diode amplifier, the rear facet reflecting an incident one of the first pair of counter-propagating light beams, forming an output beam of the laser system being emitted at an emission angle corresponding to the incident angle.

It is a further advantage of the invention that power and frequency instabilities, which known external feedback coupled cavity lasers suffer from, are avoided. It is an advantage of the present invention that the laser system is robust as it is not based on a coupled cavity effect but uses the four-wave mixing grating in the diode amplifier as an output coupler. Furthermore, as many commercially available broad-area diodes are by default produced with a highly reflective rear facet and a front facet with a low reflectivity coating, these standard diodes may advantageously be used in this embodiment, thereby reducing the cost of the laser system. Furthermore, it is an advantage of this embodiment that it is compact.

Preferably, the low-reflectivity coating provides a reflectivity of less than 10%, more preferably less than 4%, more preferably less than 1%, most preferably less than 0.5%.

When the low-reflectivity coating provides a small reflectivity, a total reflection of one of the light beams inside the amplifying medium causes a reflected beam which contributes to the four wave mixing process. In one embodiment, the low-reflectivity coating is selected to provide a reflectivity between 0.1% and 0.5%.

In a further preferred embodiment of the invention, the first reflective member is the front facet of the diode amplifier, the front facet being tilted by a predetermined tilt angle relative to the rear facet, and the front facet being coated with a coating providing a higher reflection coefficient for a light beam with an incident angle of zero degrees relative to an axis normal to the front facet than a reflection coefficient of a light beam with an incident angle corresponding to the tilt angle. Consequently, it is an advantage of this embodiment that it provides a very compact laser system, where all components are embedded in a single broad-area diode. Furthermore, in this embodiment, no external components, such as external mirrors, filters, or the like need to be aligned, thereby providing a laser system which is very suitable for mass production. The coating may comprise a dielectric multilayer coating or any other suitable coating known in the art, preferably providing a high angle selectivity.

According to still another embodiment of the invention, the system further comprises a frequency conversion member. The term frequency conversion member comprises a frequency doubler, an optical parametric oscillator, etc., for frequency conversion of at least part of the light beam incident on the frequency conversion member. Consequently an output light beam of the laser system is provided having a selected wavelength. For example, the laser system may further comprise a frequency doubler for frequency doubling at least part of the incident light beam so that the wavelength of the coherent light beam is substantially equal to half the wavelength of the incident light beam.

Many new developments in medicine, optical storage, printing, and information technology require high-power laser light in the blue and violet parts of the spectrum. Blue and violet light is generally produced by frequency doubling of the output from longer-wavelength lasers. However, to do this efficiently requires the high intensities normally available only from pulsed lasers or high-power CW lasers.

Therefore, the main sources of blue and violet light to date have been Nd: YAG lasers using second-harmonic generation and sum-frequency upconversion. However, a high power laser diode instead of a Nd: YAG laser has considerable advantages, since it provides a small, compact laser system which does not require a bulky power supply, water cooling, or the like.

Several research teams have investigated second-harmonic generation with diode lasers (e.g. W. J. Kozlovsky, W. P. Risk, W. Lenth, B. G. Kim, G. L. Bona, H. Jaeckel, and D. J. Webb, "Blue light generation by resonator-enhanced frequency doubling of an extended-cavity diode laser," Appl. Phys. Lett. 65, 525-527 (1994)). However, the low power available from a single infrared laser diode limits the usefulness of the resulting frequency-doubled output.

Laser diode arrays can provide a much higher output power. However, as described above, known laser diode arrays suffer from low spatial and temporal coherence, thereby causing frequency-doubling to be limited to low power.

According to the invention, laser diodes with self-induced dynamic four-wave mixing gratings yield output beams with much better spatial and temporal coherence, and are therefore particularly well-suited for high-power blue lasers based on frequency doubling.

In a preferred embodiment the system further comprises a third reflective member adapted to reflect said output beam back in the diode amplifier; and a frequency conversion member placed between the first reflective member and the diode amplifier. Hence, as the output beam is reflected back into the diode amplifier, the intensity in the cavity defined by the first reflective member the four-wave mixing process in the diode amplifier is increased, thereby providing a high power beam with good spatial and temporal coherence as an input to the frequency doubler.

The present invention can be implemented in different ways including the system described above and in the following, a method of aligning such a system, and further product means, each yielding one or more of the benefits and advantages described in connection with the first-mentioned system, and each having one or more preferred embodiments corresponding to the preferred embodiments described in connection with the first-mentioned system and disclosed in the dependant claims.

BRIEF DESCRIPTION OF THE DRAWINGS

The invention will be explained more fully below in connection with preferred embodiments and with reference to the drawing, in which:

FIGS. 8a-d illustrate measured intensity profiles of a laser system according to FIG. 4a.

DETAILED DESCRIPTION OF THE INVENTION

Figure 1A:
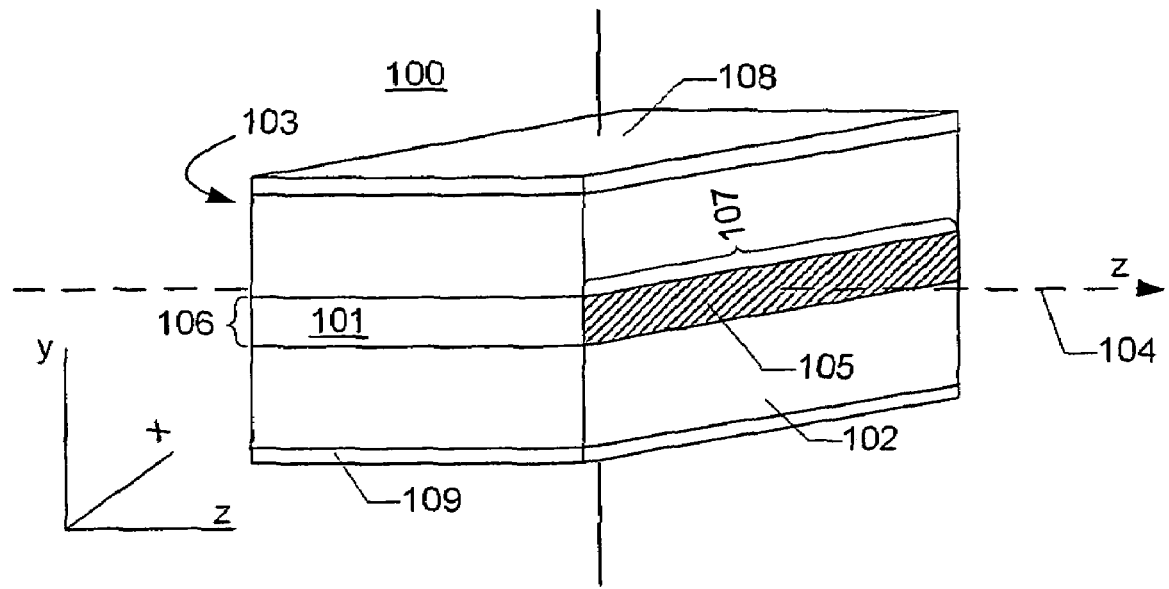
FIGS. 1*a-b* show a prior art broad-area diode.
Figure 1B:
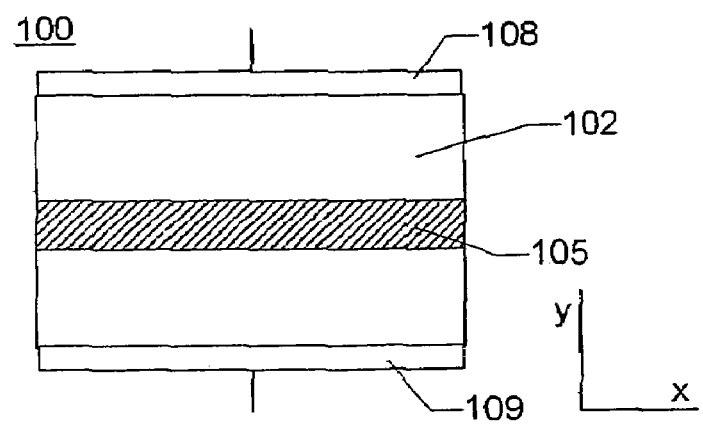
Figure 2A:
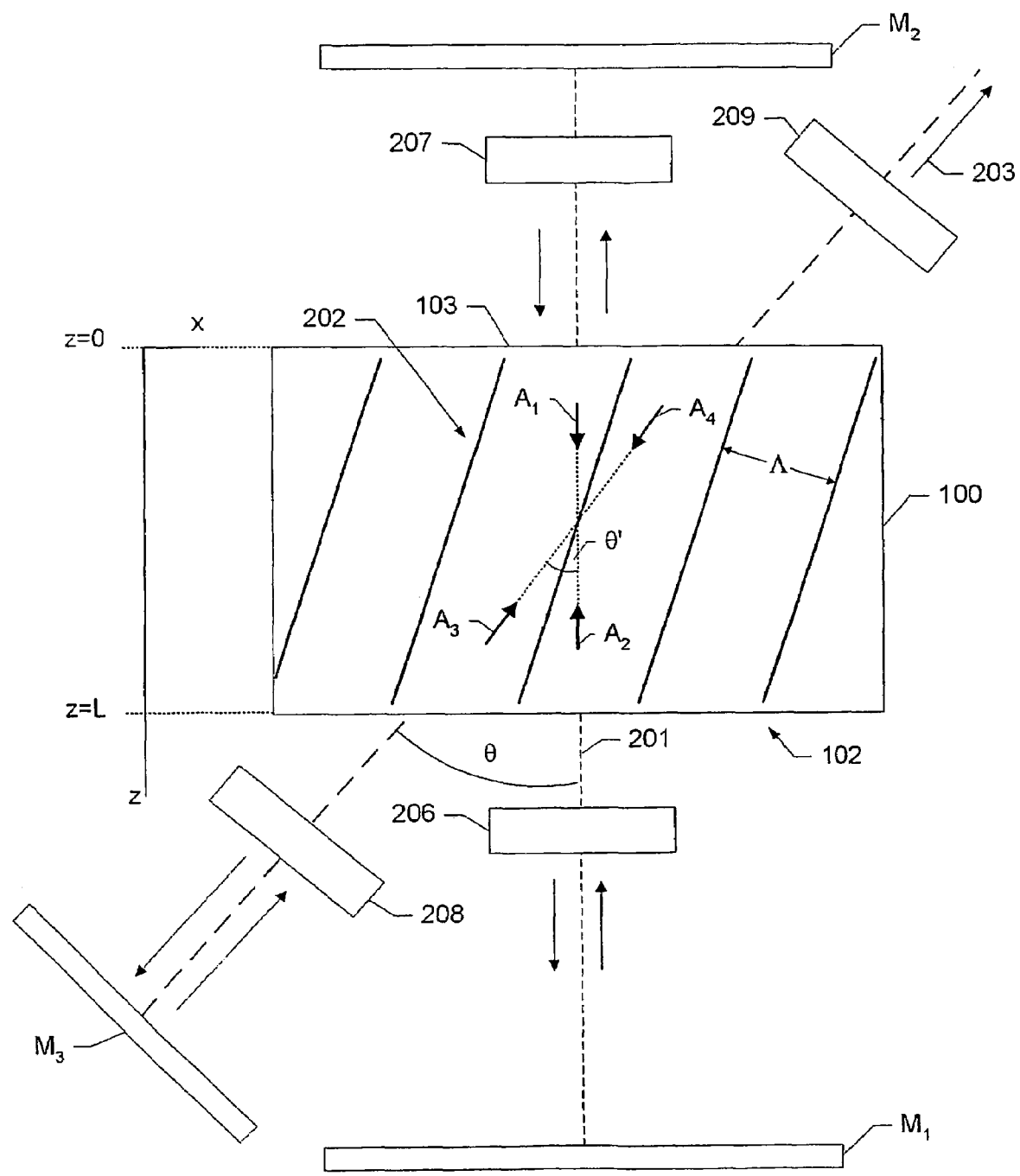
FIGS. 2*a-b* schematically show examples of a laser system according to a first embodiment of the invention.
Figure 2B:
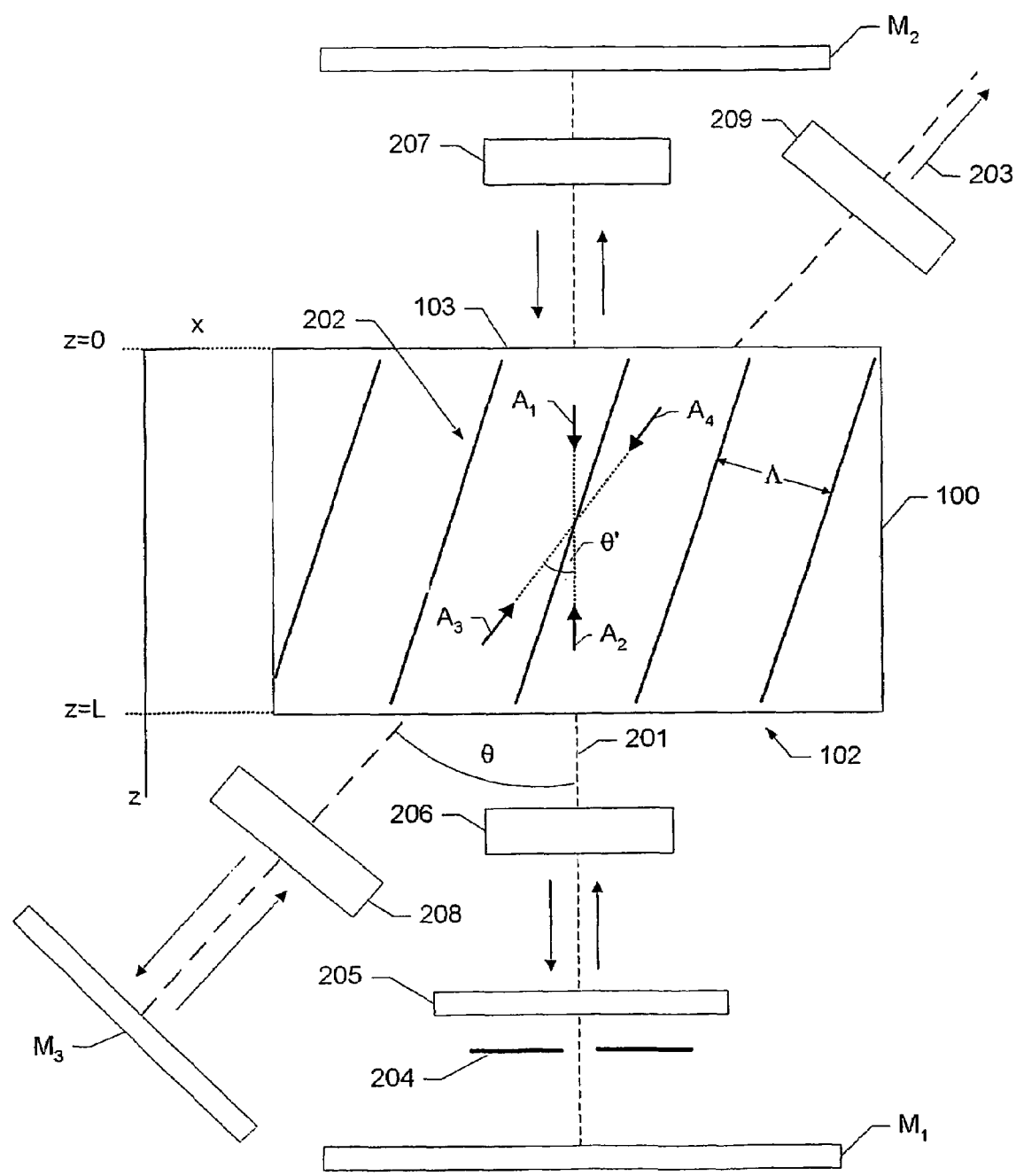

FIGS. 2a-b schematically show examples of a laser system according to a first embodiment of the invention. Referring to FIG. 2a, the laser system according to this embodiment comprises a broad-area diode amplifier 100, e.g. a broad-area diode as shown in FIGS. 1a-b, and three mirrors $M_1$, $M_2$, and $M_3$. The mirrors may be conventional plane or concave mirrors, for example having a reflectivity between 0.3 and 1. Alternatively, gratings may be used instead of mirrors, or any other suitable reflective member. In one embodiment, the broad-area diode is a GaAlAs diode with a wavelength of 808 nm. Preferably, the broad-area diode 100 has a stripe width of 200 μm or larger, e.g. 500 μm, and the front and rear facets 102 and 103 are coated with crystal antireflection coatings, preferably with a reflectivity of less than $10^{-4}$. When an electrical current is applied to the diode 100, and the current is higher than the critical current $I_{th}$ of the diode, the laser diode emits a laser beam. However, even if the applied current is smaller than the critical current, the semiconductor material acts as an amplifying medium for a light beam propagating through it. The mirrors $M_1$ and $M_2$ are positioned on opposite sides of the diode, such that they generate a cavity defining an optical axis 201, the diode 100 being inside the cavity. Hence, the mirrors $M_1$ and $M_2$ reflect light emitted from the amplifying medium along the optical axis 201 back into the diode 100 along that axis 201, thereby generating a pair of counter propagating waves $A_1$ and $A_2$, respectively, in the amplifying medium. Due to the antireflection coating on the end facets 102 and 103, the laser cavity is defined by the mirrors $M_1$ and $M_2$, since laser action due to oscillations between the two end facets of the semiconductor is avoided. The mirror $M_3$ is positioned with its normal vector having an angle θ with the optical axis 201, i.e. such that it reflects light emitted at an angle θ relative to the optical axis 201 back into the amplifying medium of the diode 100 at the same angle θ. Consequently, a wave $A_4$ propagating in the amplifying medium towards the mirror $M_3$ is reflected as a corresponding wave $A_3$ inside the amplifying medium. It should be noted that inside the amplifying medium the waves $A_3$ and $A_4$ propagate at an angle θ' relative to the optical axis, where θ and θ' are related via the refractive index n of the amplifying medium according to sin θ=n sin θ' due to refraction at the facet 102. Preferably, the angle θ is small, e.g. between 1 and 15 degrees. It is further noted that for most amplifying materials, the difference between θ and θ' is larger than indicated in the schematic diagram of FIG. 2a. The four waves $A_i$, i=1, . . . , 4, interact inside the diode laser gain medium such that a gain and refractive index grating 202 is induced by the interference between $A_1$ and $A_4$ and between $A_2$ and $A_3$, respectively. When two beams interfere in the stripe region of the diode laser, they cause a dynamic modulation of the carrier density in the medium and, thus, a modulation of the optical properties of the medium, i.e. its refractive index, the absorption coefficient, etc. Consequently, the interference causes a dynamic gain and refractive index grating 202 which, in turn, causes the waves in the amplifying medium to be deflected. The output laser beam 203 is coupled out of the cavity from the rear facet 103 of the laser diode 100 by a lens system 209, resulting in a high-power laser output beam with high spatial and temporal coherence. For example, the lens system 209 may comprise a beam expander consisting of two cylindrical lenses. The purpose of this beam expander is to transform the output beam into a circular beam 203. Alternatively, any other suitable output coupler may be used. In another embodiment, the output beam may be coupled out from the mirror $M_3$. In a further alternative embodiment, an output laser beam may be coupled out from one of the mirrors M1 and M2 having a non-vanishing transmission. Hence, when the laser beam is coupled out from the four-wave mixing diode, the output beam may have a propagation direction that is different from those of the cavity beam.

The system further comprises optical lens systems 206-207 positioned on respective sides of the diode amplifier 100 inside the cavity defined by mirrors $M_1$ and $M_2$, and a lens system 208 positioned between the diode 100 and mirror $M_3$. The purpose of the lens systems 206-208 is to ensure a proper input and output coupling of the light beams $A_1$, . . . , $A_4$, respectively, from the diode amplifier without optical distortions. Preferably, each of the lens systems comprises a lens for collimating the respective laser beams along the slow axis and a lens for collimating the beam along the fast axis. However, it is understood that other known lens systems for output coupling a laser beam from a laser diode may be used, e.g. lens systems with more than two lenses. Preferably, in order to provide a strong and efficient grating 202, high quality lenses should be employed which reduce optical distortions of the laser beams, thereby ensuring that the counter-propagating pairs of waves each comprise corresponding waves propagating in opposite directions. The distances between the diode 100 and the mirrors M1, M2, and M3 are determined by the lens systems 206-208, respectively. For macro-optical lens systems the distances may, in one embodiment, be 10-40 cm. For micro-optical lens systems, the distances may, in one embodiment, be 0.5-10 cm. Preferably, the distances between the mirrors and the diode are selected to be as short as possible, thereby providing a compact laser system.

Inside the gain medium of the diode 100 the four waves exchange energy and phase, and, due to the nonlinearity of the semiconductor medium, the gain and the refractive index depend on the resulting spatial intensity distribution of the interacting light beams. The exchange of energy and phase between the four waves $A_1$-$A_4$ are governed by the following four coupled wave equations:

$$\frac{dA_1}{dz} = -\alpha_0 A_1 - \gamma(A_1 A_4^* + A_2^* A_3)A_4 \quad (1A)$$

$$\frac{dA_2^*}{dz} = +\alpha_0 A_2^* - \gamma(A_1 A_4^* + A_2^* A_3)A_3^* \quad (1B)$$

$$\frac{dA_3}{dz} = +\alpha_0 A_3 + \gamma(A_1 A_4^* + A_2^* A_3)A_2 \quad (1C)$$

$$\frac{dA_4^*}{dz} = -\alpha_0 A_4^* + \gamma(A_1 A_4^* + A_2^* A_3)A_1^* \quad (1D)$$

where $\alpha_0$ is the effective gain of the medium and γ is a parameter describing the efficiency of the exchange of phase and energy between the four beams due to the mixing process. The magnitude of γ is determined by the nonlinear susceptibility $\chi^{(3)}$ of the active semiconductor material. The asterix '*' indicates complex conjugation. The gain in the semiconductor originates from the active pn-junction with an applied electric field. In Eq. (1) the first terms $\alpha_0 A_i$ on the right hand side correspond to the effective gain in the semiconductor material and the second terms $\gamma(A_i A^*_4 + A^*_2 A_3)A_i$ describe the exchange of phase and energy between the four beams. Eq. (1) may be used to calculate the intensity distribution of the four interacting beams. In Eq. (1) it is assumed that only two four-wave mixing gratings, known as transmission gratings, dominate. In this transmission grating configuration one of the transmission gratings arises from the interference between beams $A_1$ and $A_4$ and the other comes from the interference between $A_2$ and $A_3$. The two transmission gratings have the same gratings vector and they add coherently. In eq. (1), the contribution from the interference between waves $A_2$ and $A_4$ and the interference between the waves the $A_1$ and $A_3$ are neglected since they have a small fringe spacing and consequently are washed out due to diffusion.

The above phenomenon is known as four-wave mixing (FWM). As the four interacting beams in FIG. 2a are generated by reflections at the mirrors $M_1$, $M_2$, and $M_3$, they all have substantially the same frequency. In this situation the mixing process is referred to as Degenerate Four-Wave Mixing (DFWM). If there are small differences in frequencies between the interacting light beams, the mixing process is referred to as Nearly Degenerate Four-Wave Mixing (NDFWM). The phenomenon of four wave mixing as such is known. For example, from P. Kürz, R. Nagar, and T. Mukai, "Highly efficient conjugation using spatially nondegenerate four-wave mixing in a broad-area diode" (Appl. Phys. Lett. 68, pp. 1180-1182, 1996) it is known to use a four-wave mixing process as a phase-conjugate mirror, where a strong external pump beam $A_1$ and a weak external probe beam $A_3$ are injected into a broad-area diode with a reflecting rear facet. The pump beam is injected normally to the front facet of the diode, while the probe beam is injected at an angle relative to the pump beam. In this configuration, the pump beam $A_1$ reflected from the rear facet is deflected by the grating generated due to the interference of $A_1$ and $A_4$. The deflected beam produces a conjugate signal beam $A_4$ which is counter propagating to the incident probe beam. The four-wave mixing configuration with strong pump beams described by P. Kürz et al. yields a reflection coefficient $R_{DFWM}=|A_4(L)|^2/|A_3(L)|^2$ much larger than one. Consequently, this nonlinear mirror leads to amplification of the laser beam and laser action takes place in the cavity.

Hence, in the above prior art configuration, the four wave mixing occurs between strong pump beams $A_1$ and $A_2$, and weak probe and signal beams $A_3$ and $A_4$, respectively.

While the above prior art system is only concerned with the use of a four-wave mixing process as a phase-conjugate mirror, the present invention utilizes a four wave mixing process to provide an improved high-power laser system including a diode amplifier with a large transverse gain area which generates a high-power output beam having good coherence properties. Furthermore, in contrast to the above prior art configuration, the four-wave mixing according to the invention is used in a self-pumped configuration. In the embodiment of FIG. 2a, the two pump beams needed for the four-wave mixing process are produced in the cavity formed by $M_1$ and $M_2$, i.e. without any external pump beams, thereby providing a simple and inexpensive configuration. Furthermore, the mirror $M_3$ is used to establish a laser cavity with the mirror $M_3$ as one cavity mirror and the four-wave mixing process in the semiconductor amplifier as the other cavity mirror. According to the invention, the semiconductor amplifier offers self-pumped four-wave mixing where $R_{DFWM}$ is larger than unity, because strong pump beams are built up in the amplifying semiconductor.

According to the invention, the longitudinal dimension of the laser diode, i.e. the distance between the two facets 102 and 103, and the angle θ influence the properties of the gain and refractive index grating.

Figure 3A:
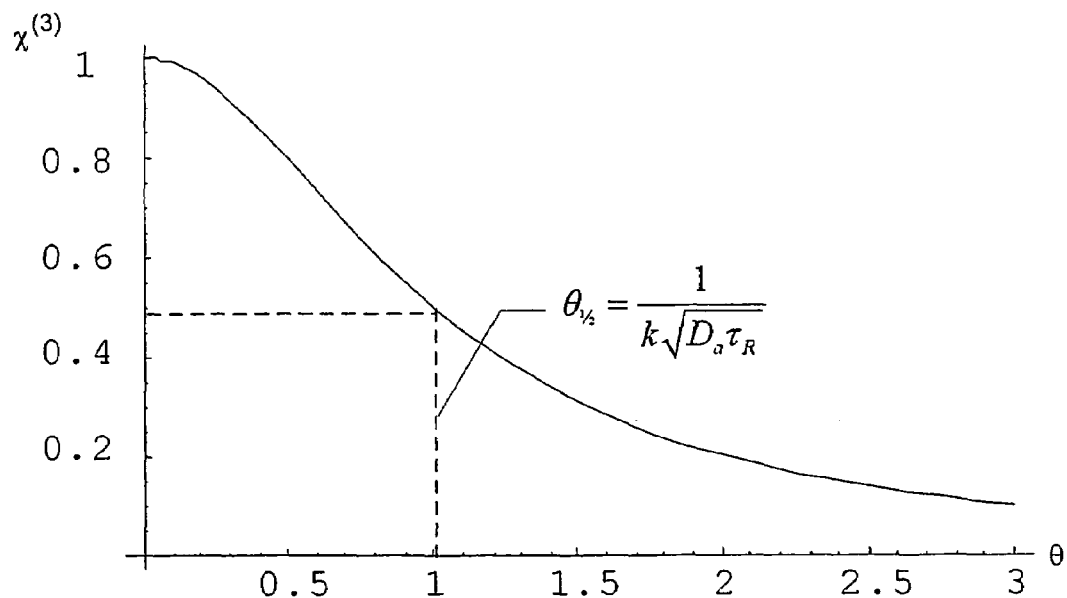
FIG. 3*a* schematically illustrates the dependence of the strength of the induced grating on angle between the interfering laser beams.

Referring to FIG. 3a, the diffraction efficiency of the induced gratings is given by the magnitude of the third order nonlinear susceptibility $\chi^{(3)}$, which depends on the angle θ, as illustrated in FIG. 3a. The physical origin of this nonlinear susceptibility is generation of carriers governed by the rate equation (see e.g. M. Lucente, J. G. Fujimoto and G. M. Carter, Appl. Phys. Lett. 53, pp. 1897-1899, 1988)

$$\frac{dN}{dt} = R - \frac{N}{\tau_R} + D_a \nabla^2 N - g(N)|E_T|^2 \qquad (2)$$

where N is the excited carrier population, R is the pumping rate, $\tau_R$ is the carrier lifetime, $D_a$ is the ambipolar diffusivity, g(N) is the carrier density dependent gain, and $E_T$ is the total optical electric field.

In the limit of low optical power equation (2) may easily be solved giving an effective lifetime of the carriers:

$$\tau_{eff} = \frac{1}{\frac{1}{\tau_R} + k^2\theta^2 D_a}, \qquad (3)$$

where $k=2\pi/\lambda$ is the propagation constant, and λ the vacuum wavelength. For high power levels the effective lifetime of the carriers $\tau_{eff}$ becomes smaller than the value given in equation 3 (see e.g. D. Zhu, S. Dubovitsky, W. Steier, K. Uppal, D. Tishinin, J. Burger, and P. Dapkus, Appl. Phys. Lett. 70, pp. 2082-2084, 1997) Since the third order susceptibility is directly proportional to the lifetime of the population we obtain:

$$\chi^{(3)} = \frac{\chi^{(3)}_{max}}{1 + k^2\theta^2 D_a \tau_R} \qquad (4)$$

where $\chi_{max}^{(3)}$ is the optimum value of the nonlinear susceptibility at θ=0. This third order nonlinear susceptibility determines the strength of the gratings. The washout of the induced grating due to carrier recombination and diffusion calculated from Eq. (4) is shown in FIG. 3a. Eq. (4) implies that the largest amplitude in the induced gratings is obtained for small angles and is reduced to half the maximum at an angle corresponding to:

$$\theta_{\frac{1}{2}} = \frac{1}{k\sqrt{D_a \tau_R}} \qquad (5)$$

Consequently, the angle θ should be less than $\theta_{1/2}$ if strong nonlinear four-wave mixing interaction inside the active semiconductor is required. The third order nonlinear susceptibility in FIG. 3a is plotted versus the angle θ between the interfering laser beams. In FIG. 3a, the angle is measured in units of $(k(D_a \tau_R))^{-1/2}$. For example, in the case of GaAlAs the parameters are $D_a$=13 cm²/s (see J. Buus and M. Danielsen, IEEE J. of QE, QE-13, pp. 669-674, 1977) and $\tau_R$=1 ns and, consequently, we obtain at 810 nm $\theta_{1/2}$ =6.5°. However, since the carrier lifetime depends on the intensity this value is increased for high output power levels. Inside the active semiconductor laser the output beam is a result of the interaction between nonlinear properties of the medium described by $\chi^{(3)}$ and the laser beams and, consequently, $\chi^{(3)}$ should be optimized in order to obtain a high power output beam.

Again referring to FIG. 2a, the output beam 203 is a result of diffraction in the induced gratings 202 inside the semiconductor amplifier 100. The diffraction angle θ' inside the semiconductor is given by: sin θ'=λ/(Λn). A beam diffracted by the induced grating at one end of the medium is advanced in phase relative to a beam diffracted at the other end of the medium. For small angles the phase difference between a wave diffracted at the front facet 102 and the rear facet 103 of the amplifier is given by:

$$\delta = 2\pi nL/\lambda - 2\pi nL \cos \theta'/\lambda = 2\pi nL(1-\cos \theta')/\lambda \quad (6)$$

Since $1-\cos \theta' = 2 \sin^2(\theta'/2)$ and n sin θ'=sin θ we obtain for small angles θ:

$$\delta = \frac{\pi L}{n\lambda}\theta^2, \quad (7)$$

where θ is the diffraction angle in free space which is identical to the angle between $A_1$ and $A_4$ outside the diode amplifier as controlled by the orientation of the mirror $M_3$.

It is noted that in the above discussion it is assumed that the grating extends over substantially the entire longitudinal extension of the laser diode, i.e. that the width of the grating in the direction of the optical axis 201 is substantially equal to the width L of the laser diode. If, in an alternative embodiment, the active region with the induced grating does not extend over the entire width of the diode, the actual width of the grating should be used in the above equation instead of the width L of the diode.

If the phase difference δ is small, the beams diffracted in different regions of the grating interfere constructively. However, if the phase difference is large, destructive interference occurs, thereby efficiently suppressing spatial laser modes which do not fulfil the Bragg condition. In particular, if the phase difference δ is larger than 2π, only the beam incident at the Bragg angle leads to a diffracted beam—all other laser modes are effectively suppressed. On the other hand, if δ is much smaller than one, all laser modes are diffracted in the grating with almost the same efficiency. Therefore δ plays the role as mode suppression factor. In practice, δ should be substantially larger than 2π in order to provide effective suppression of different axial modes in the broad area amplifier. It Is noted that the phase difference δ depends on the length L of the laser diode. Consequently, the mode suppression of undesired modes is particularly efficient for long diodes.

Figure 3B:
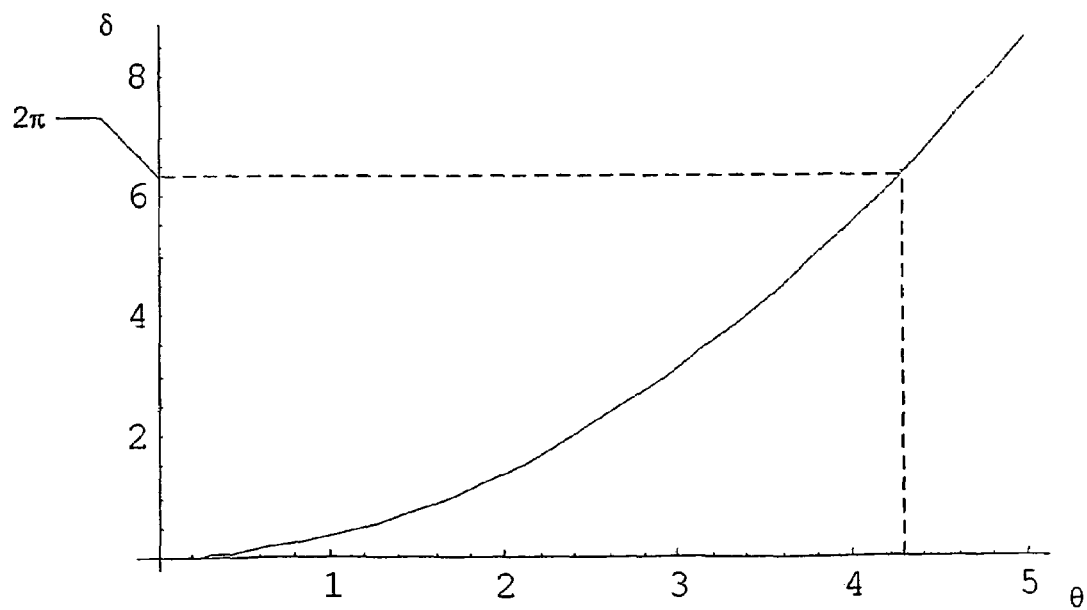
FIG. 3*b* illustrates the mode suppression factor of the induced grating as a function of the angle between the interfering laser beams.

Now referring to FIG. 3b, the mode suppression factor versus the angle θ is shown for a 1 mm long amplifier. In this case angles larger than approx. 4° lead to effective suppression. The critical angle for which mode suppression occurs depends on the length of the amplifier and is determined by:

$$\theta_{crit} = \sqrt{\frac{2n\lambda}{L}} \quad (8)$$

where we have inserted δ=2π in Eq. (7). Inserting L=1 mm, n=3.4, λ=810 nm for GaAlAs we obtain $\theta_{crit}$=4.2°. Therefore, in this example, the angle should be larger than 4.2° in order to have good mode suppression but at the same time it should be less than $\theta_{1/2}$=6.5° to have strong gratings in the semiconductor.

Consequently, in order to efficiently suppress undesired spatial modes, the thickness of the laser diode should be selected such that the above parameter δ is sufficiently larger than 1, preferably larger than 2 π.

In general, the choice of the angle θ and, thus, the angle between the laser beams $A_1$ and $A_4$, and the beams $A_2$ and $A_3$, respectively, which induce the dynamic grating 202, influences the coherence properties of the output beam 203 of the laser system. As described above, the strength of the induced grating is determined by the spatial variation of the carrier density induced by the laser beams in the active medium. The strength of the grating decreases if the fringe spacing Λ approaches the characteristic diffusion length of the amplifying medium. Furthermore, as described above, the angle should be selected sufficiently large in order to ensure an efficient suppression of undesired modes. Hence, the grating should preferably be strong and, at the same time, selective, i.e. it should efficiently suppress the undesired modes. According to the invention, this is achieved when the angle θ is selected according to:

$$\sqrt{\frac{2n\lambda}{L}} = \theta_{crit} < \theta < \theta_{\frac{1}{2}} = \frac{1}{k\sqrt{D_a \tau_R}}. \quad (9)$$

It should be noted that the limiting angles $\theta_{crit}$ and $\theta_{1/2}$ are not hard limits in the sense that the gratings completely disappear as soon as θ>$\theta_{1/2}$ or that the mode suppression completely vanishes θ<$\theta_{crit}$, as illustrated by FIGS. 3a-b, respectively. Hence, θ may be selected according to $\kappa_1$ $\theta_{crit}$<θ<$\kappa_2$ $\theta_{1/2}$, where $1 \geq \kappa_1$ is a suitably selected constant, preferably $\kappa_1$>0.5, more preferably $\kappa_1$>0.75, most preferably $\kappa_1$=1. Similarly, the constant $\kappa_{2 \geq 1}$ is preferably selected as $\kappa_2$<2, more preferably $\kappa_2$<1.5, most preferably $\kappa_2$=1.

It is noted that the selected mode depends on the gain, and the actual gain is an increasing function of the angle θ. Thus, the actual interval of preferred angles according to eqn. (9) may be slightly shifted towards higher angles.

It is further noted that, according to eqn. (9), the parameters of the laser system should be selected such that $\theta_{crit}$<$\theta_{1/2}$. In particular, the length L of the laser diode should, preferably, be selected sufficiently large.

It is further noted that the lens systems 207 and 209 may be implemented as separate lens systems or as a single lens system, since the angle θ is small. Similarly the lens systems 206 and 208 may be implemented as separate lens systems or as a single lens system.

Now referring to FIG. 2b, a laser system as the one described in connection with FIG. 2a comprising a laser diode 100, reflective members $M_1$, $M_2$, and $M_3$, and optical lens systems 206-209 may further comprise one or more of the following components: A spatial filter 204 may be placed in the cavity formed by the mirrors $M_1$ and $M_2$. For example, the spatial filter 204 may include a narrow slit, e.g. formed by two blades with sharp edges. Preferably, the position and aperture of the spatial filter are adjustable. The purpose of this spatial filter is to increase the efficiency of the four wave mixing process. Preferably, the spatial filter is aligned such that the slit is positioned transversal to the stripe of the laser diode to efficiently select a single transversal mode.

Furthermore, a frequency filter 205, e.g. a Fabry-Perot etalon, may be placed in the cavity. The purpose of the filter 205 is to increase the mutual coherence of the interacting laser beams and to reduce the spectral bandwidth of the cavity beam, thereby enhancing the efficiency of the four-wave mixing process.

Alternatively or additionally, a spatial filter and/or a frequency filter may be placed between mirror $M_2$ and the diode 100, and/or in the cavity formed by the mirror $M_3$ and the diode 100.

It is noted that for many applications it is important to achieve an output power which is as high as possible and, at the same time, a high spatial and temporal coherence. Therefore, the output power $|A_3(0)|^2$ should be optimised. In the following a number of parameters are discussed which determine the output power and the spatial and temporal coherence of the output beam in the embodiments of FIGS. 2a-b.

The actual power level depends on a number of parameters and effects: Since the pump beams are built up in the cavity formed by the two mirrors $M_1$ and $M_2$, a high output power may be achieved by optimising the intensities of the two pump beams $A_1$ and $A_2$. The reflectivities $R_1$ and $R_2$ of the two mirrors $M_1$ and $M_2$, respectively, influence the energy transfer in the diffraction process: Preferably, $R_1$ and $R_2$ are selected to be substantially equal to 1 in order to optimize the output beam 203. Furthermore, the reflectivity $R_3$ of the mirror $M_3$ may be used to optimise the intensity in the cavity. Preferably, $R_3$ is selected to be substantially equal to 1.

As mentioned above, alternatively or additionally, an output beam may be coupled out at the mirror $M_3$, e.g. if the mirror $M_3$ is a partially transparent mirror. In this case, the output power to be optimised is $|A_4(L)|^2(1-R_3)$, $R_1$ and $R_2$ are selected to be substantially equal to 1, thereby providing a high output power of an output beam coupled out at $M_3$.

Furthermore, the gain in the semiconductor determines the power level of the pump beams. Finally, the nonlinear susceptibility of the semiconductor gain material determines the efficiency of the four-wave mixing process as described above. Examples of suitable semiconductor materials include but are not restricted to InGaAlP lasing in the region 630-690 nm, GaAlAs lasing in the region 780-870 nm, InGaAs lasing in the region 900-1020 nm, and InGaAsP lasing in the region 1500-2100 nm.

Figure 4A:
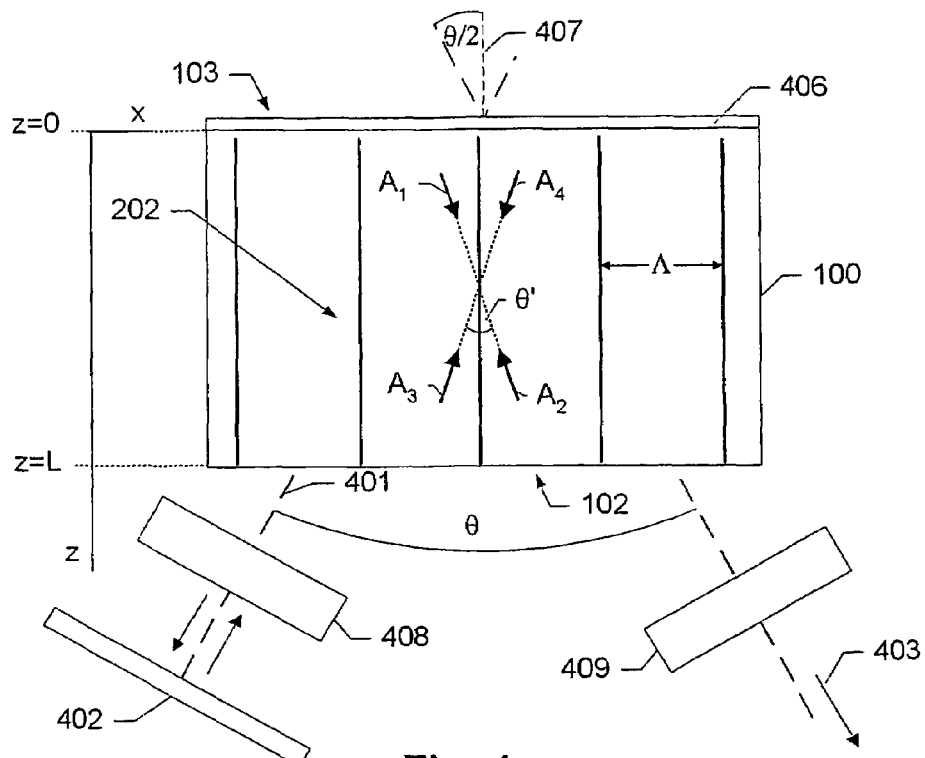
FIGS. 4*a-b* schematically show examples of a laser system according to a second embodiment of the invention.
Figure 4B:
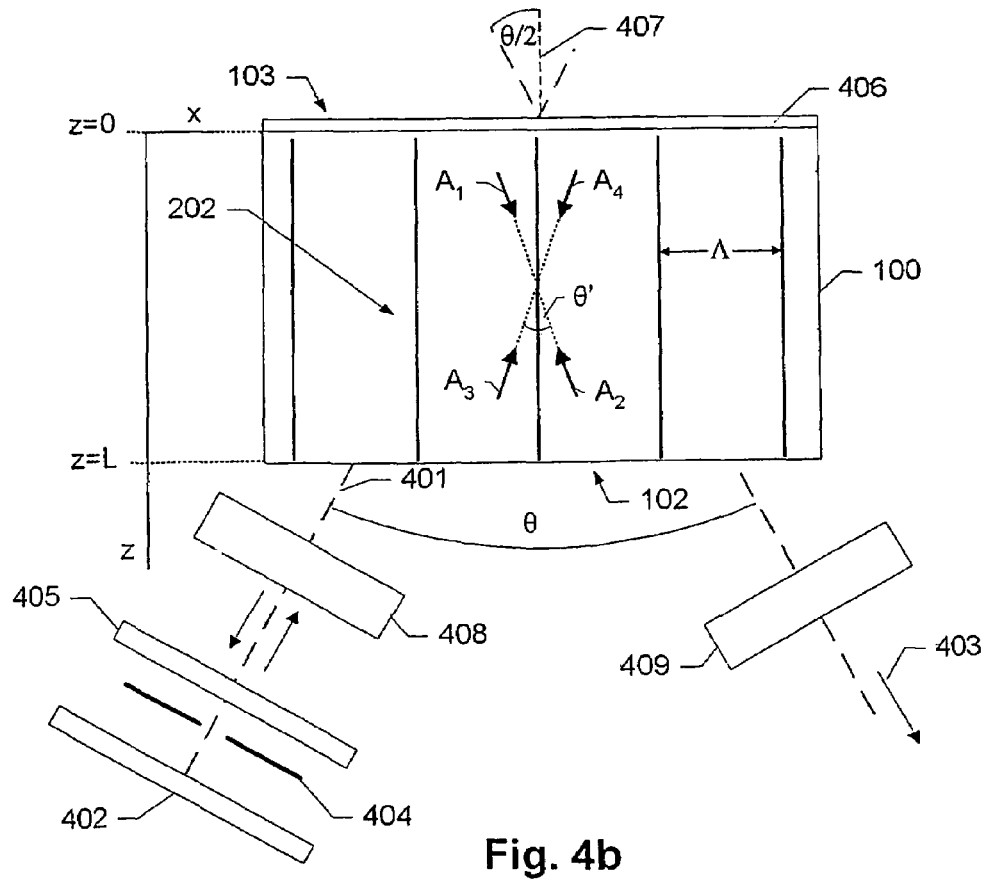

FIGS. 4a-b schematically show examples of a laser system according to a second embodiment of the invention. Referring to FIG. 4a, the laser system according to this embodiment comprises a broad-area diode amplifier 100, e.g. a broad-area diode as shown in FIGS. 1a-b, and a mirror 402. The mirror 402 may be a conventional plane or concave mirror. Alternatively, to the mirror 402, a grating may be used or any other suitable reflective member. Preferably, the broad-area diode, e.g. a GaAlAs broad-area diode with $\lambda$=810 nm, has a stripe width of 200 µm or larger, e.g. 500 µm, and the front facet 102 is coated with a low-reflectivity coating, preferably providing a reflectivity of $R<10^{-2}$, e.g. between 0.2% and 0.5%. Preferably, the rear facet 103 is coated with a high-reflectivity coating 406, e.g. with a reflectivity of $R_1>0.98$. When an electrical current is applied to the diode 100, and the current is sufficiently high, the semiconductor material acts as an amplifying medium. According to the invention, a gain and refractive index grating 202 is induced in the amplifying medium by a four-wave mixing process as described in connection with FIG. 2a. The dynamic grating 202 is induced by a four-wave mixing process of two pairs of counter propagating waves $A_1, A_2$ and $A_3, A_4$, respectively, which may be described by the corresponding equations (1A)-(1D) above. The mirror 402 and the four-wave mixing process form a cavity defining an optical axis 401 such that the optical axis 401 deviates from the normal 407 of the diode facets by an angle $\theta/2$. Consequently, a wave $A_4$ propagating inside the amplifying medium towards the mirror 402 is reflected as a corresponding wave $A_3$ inside the amplifying medium. Furthermore, the wave $A_3$ is reflected at the high-reflectivity rear facet 103, and the reflected wave generates a pump beam $A_1$. Consequently, in this embodiment using a high-reflectivity coating at the rear facet of the diode amplifier, the forward pump beam $A_1$ is produced from a single internal reflection on the rear facet of the laser cavity. Hence, a high-power laser output beam 403 with high spatial and temporal coherence is obtained from the forward pump beam $A_1$ itself, since this beam is amplified in the diode and at the same time filtered spectrally and spatially in the four-wave mixing grating 202. The output beam 403 includes two contributions, one from the internal reflection at the rear facet and the other from diffraction in the four-wave mixing grating. The boundary conditions for the four waves are:

$A_2(L)=0$, as there is no laser beam propagating towards the diode counter propagating the output beam 403. Hence, disregarding any contribution from a reflection at the front facet 102 having a low-reflectivity coating, the wave $A_2$ is generated inside the amplifying medium due to diffraction in the dynamic grating. Furthermore, at the rear facet 103, the boundary conditions are $A_1(0)=R_1A_3(0)$ and $A_4(0)=R_1A_2(0)$, where $R_1$ is the reflectivity of the rear facet 103. In the case of external feedback from mirror 402 with reflectivity R the self-consistent condition for oscillation in the cavity is: $|A_3(L)|^2=|A_4(L)|^2 \cdot R_{\textit{eff}}$, where $R_{\textit{eff}}$ is an effective reflectivity that includes the loss in the external cavity including diffraction losses, in- and out-coupling losses, and the like. Since the wave $A_4$ is a four-wave mixing signal, the round trip phase shift in the cavity is zero.

As discussed in connection with FIG. 2a, the longitudinal dimension of the laser diode, i.e. the distance between the two facets 102 and 103, and the angle $\theta$ influence the properties of the gain and refractive index grating. In order to efficiently suppress undesired spatial modes, the thickness of the laser diode should be selected such that the parameter $\delta$ introduced in equation (7) is sufficiently larger than 1, preferably larger than $2\pi$.

Preferably, the angle $\theta$ is selected as described in connection with FIGS. 2a and 3a-b, i.e. preferably sufficiently large to ensure an efficient mode suppression and such that the resulting fringe spacing $\Lambda$ is larger than the characteristic diffusion length of the laser material. Preferably, the angle $\theta$ is selected as described in connection with eq. (9) above.

The system further comprises an optical lens system 408 positioned between the diode 100 and mirror 402. The purpose of the lens system 408 is to ensure a proper input and output coupling of the light beams $A_3$ and $A_4$, respectively, from the diode amplifier without optical distortions, as described in connection with the lens system 208 of FIG. 2a.

Furthermore, the system comprises a lens system 409, e.g. comprising a beam expander consisting of two cylindrical lenses. The purpose of this beam expander is to transform the output beam into a circular beam 403 as described in connection with FIG. 2a. Alternatively, any other suitable output coupler may be used.

In an alternative embodiment, the system may further comprise a further reflective member (not shown) reflecting at least a part of the output beam back into the diode amplifier, thereby providing a symmetric configuration where both legs define a cavity.

It is further noted that the lens systems 408 and 409 may be implemented as separate lens systems or as a single lens system, since the angle θ is small.

Now referring to FIG. 4b, a laser system as the one described in connection with FIG. 4a comprising a laser diode 100, a reflective member 402, and optical lens systems 408, 409 may further comprise one or more of the following components: A spatial filter 404 may be placed in the cavity formed by the mirror 402 and the rear facet 103. For example, the spatial filter may include a narrow slit, e.g. formed by two blades with sharp edges. Preferably, the position and aperture of the spatial filter are adjustable. As described in connection with the embodiment of FIG. 2b, the purpose of this spatial filter is to select a given spatial mode and to control the fringe spacing of the grating inside the semiconductor material. Preferably, the spatial filter is aligned such that the slit is positioned transversal to the stripe of the laser diode to efficiently select a single transversal mode.

Furthermore, a frequency filter 405, e.g. a Fabry-Perot etalon, may be placed in the cavity to increase the mutual coherence of the interacting laser beams and to reduce the spectral bandwidth of the cavity beam, thereby enhancing the efficiency of the four-wave mixing process.

Alternatively or additionally, a spatial filter and/or a frequency filter may be placed in the light path of the output beam 303.

Figure 5:
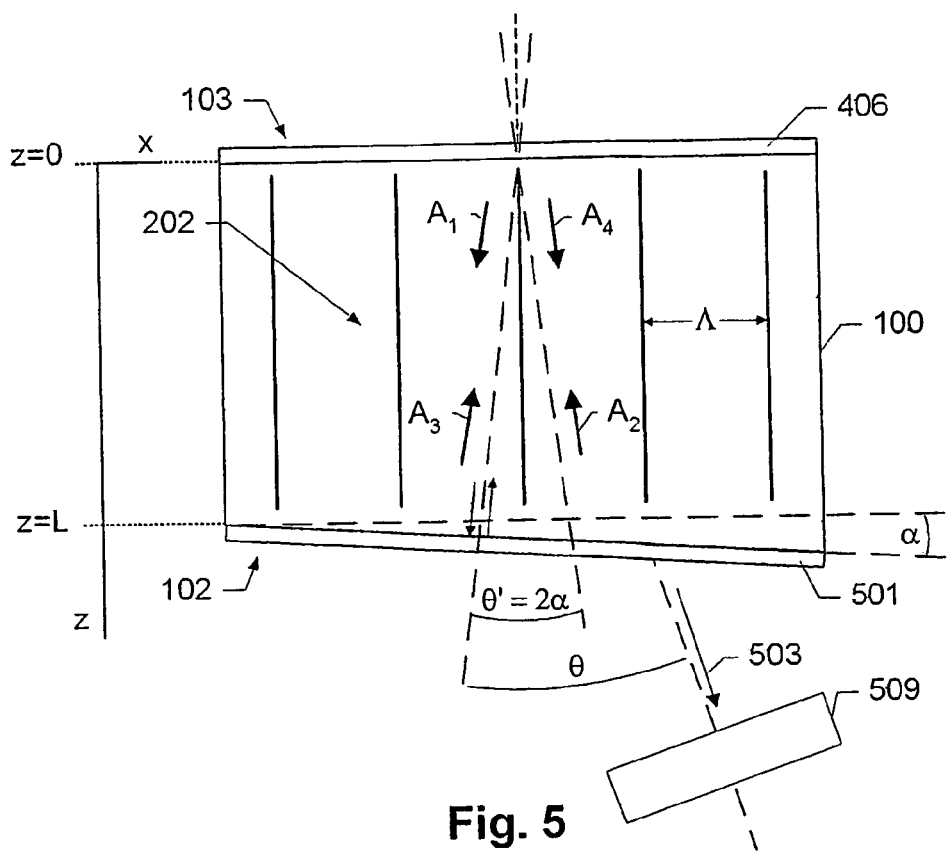
FIG. 5 schematically shows a laser system according to a fourth embodiment of the invention.

FIG. 5 shows a laser system according to a third embodiment of the invention providing a compact integrated laser system where the four-wave mixing process is produced without an external cavity. The configuration of this embodiment corresponds to the configuration of the embodiment of FIG. 4a, the external mirror 402 being replaced by a tilted front facet 102. According to this embodiment, the laser system comprises a GaAlAs broad-area diode amplifier 100. Preferably, the broad-area diode has a stripe width larger than 200 μm, e.g. 500 μm, and the rear facet 103 is coated with a high-reflectivity coating 506. The front facet 102 is coated with a coating 501 providing high reflectivity for normal incidence and low reflectivity for nonnormal incident beams. Preferably, the reflectivity of the coating is reduced to half its maximum value for a beam incident with an angle of 1 degree from the normal, more preferably, the reflectivity is reduced to half its maximum value for an incident angle of 0.5 degrees. The coating may comprise a dielectric multilayer coating or any other suitable coating known in the art. The front facet is tilted compared to the rear facet by an angle α, e.g. by cutting the wafer at the desired angle. Consequently, the reflection at this coating provides the feedback needed for inducing the gain and reflective index grating as described in connection with FIG. 4a. At the same time, the front facet 102 provides low reflectivity for the output beam, as the output beam has an angle relative to the front facet corresponding to α, thereby experiencing a low reflectivity due to the coating 501. According to this embodiment, the angle α determines the relative angle θ and, thus, the angle θ' between the laser beams inducing the grating as described above, the angle θ influences the quality and intensity of the output beam. In this embodiment θ'=2α and, consequently, the tilt angle controls the properties of the beam. Other parameters influencing the properties of the output beam include the reflectivity of the rear facet, the properties of the coating 501, and the susceptibility of the amplifying medium.

Furthermore, the system comprises a lens system 509 for collimating the output beam 503 as described in connection with the previous embodiments.

Figure 6:
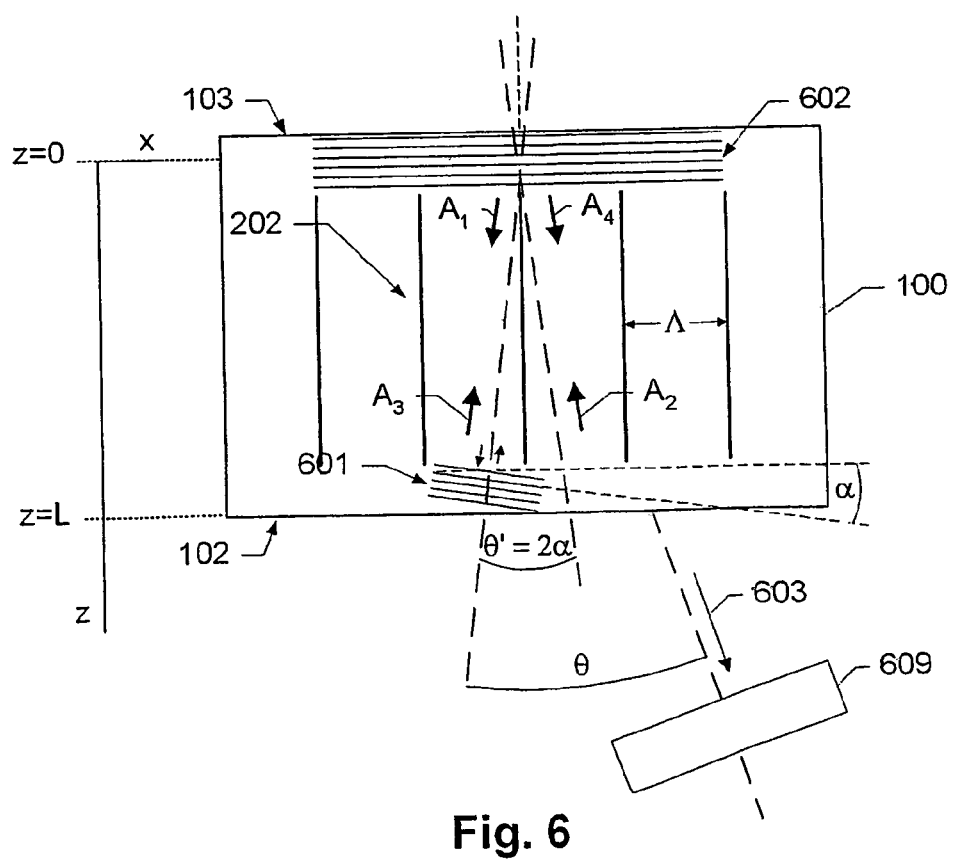
FIG. 6 schematically shows a laser system according to a fifth embodiment of the invention.

FIG. 6 shows a laser system according to a fourth embodiment of the invention corresponding to a monolithic configuration with internal permanent gratings. As above, the configuration used in this embodiment corresponds to the embodiment of FIG. 4a, the external mirror and the high-reflectivity rear facet being replaced by permanent gratings embedded in the semiconductor diode. The laser system of this embodiment comprises a GaAlAs broad-area diode amplifier 600. Preferably, the broad-area diode has a stripe width larger than 200 μm, e.g. 500 μm. During operation of this diode, a dynamic gain and refractive index grating is induced by a four-wave mixing process as described above. According to this embodiment, the feedback beam $A_3$ is generated by a first grating 601 being permanently embedded in the semiconductor diode, oriented at an angle α relative to the front facet 102 of the diode. The pump beam A1 is generated as a reflection on a second permanent grating 602 parallel to the rear facet 103 of the diode. Hence, the dynamic gain and refractive index grating is induced by a four wave mixing process by the mechanism described in connection with FIG. 4a, thereby providing a high-power laser output beam 603 with high spatial and temporal coherence. The output beam is obtained from the forward pump beam $A_1$ after amplification in the diode and spectral and spatial filtering by the four-wave mixing grating 202. The permanent gratings 601 and 602 in the semiconductor may be produced using any suitable technique known in the art, e.g. electron beam lithography, UV-induced holography, etching, or the use of photoresists. Preferably the permanent gratings should have a high angular selectivity of the gratings. The angular selectivity, in turn, increases the strength and selectivity of the induced grating 202. Hence, preferably, the gratings 601 and 602 are so-called thick gratings comprising a large number of fringes. Preferably, the grating 601 should have a reflectivity larger than 1%, whereas grating 602 should have a high reflectivity, preferably 90-100%. Furthermore, the reflection angles of gratings 601-602 should preferably be matched to the achieve the optimal angle θ as described above. Furthermore, the system comprises a lens system 609 for collimating the output beam 603 as described in connection with the previous embodiments.

It is an advantage of this embodiment of the invention that the internal gratings provide a particularly strong feedback.

It is understood that, instead of embedding the grating 602, the end facet 103 may be provided with a high-reflectivity coating for providing the internal reflection.

It is an advantage of the embodiments described in connection with FIGS. 5 and 6 that they do not require any external reflective members and corresponding lens systems, thereby providing a simple, compact, and robust configuration.

Figure 7:
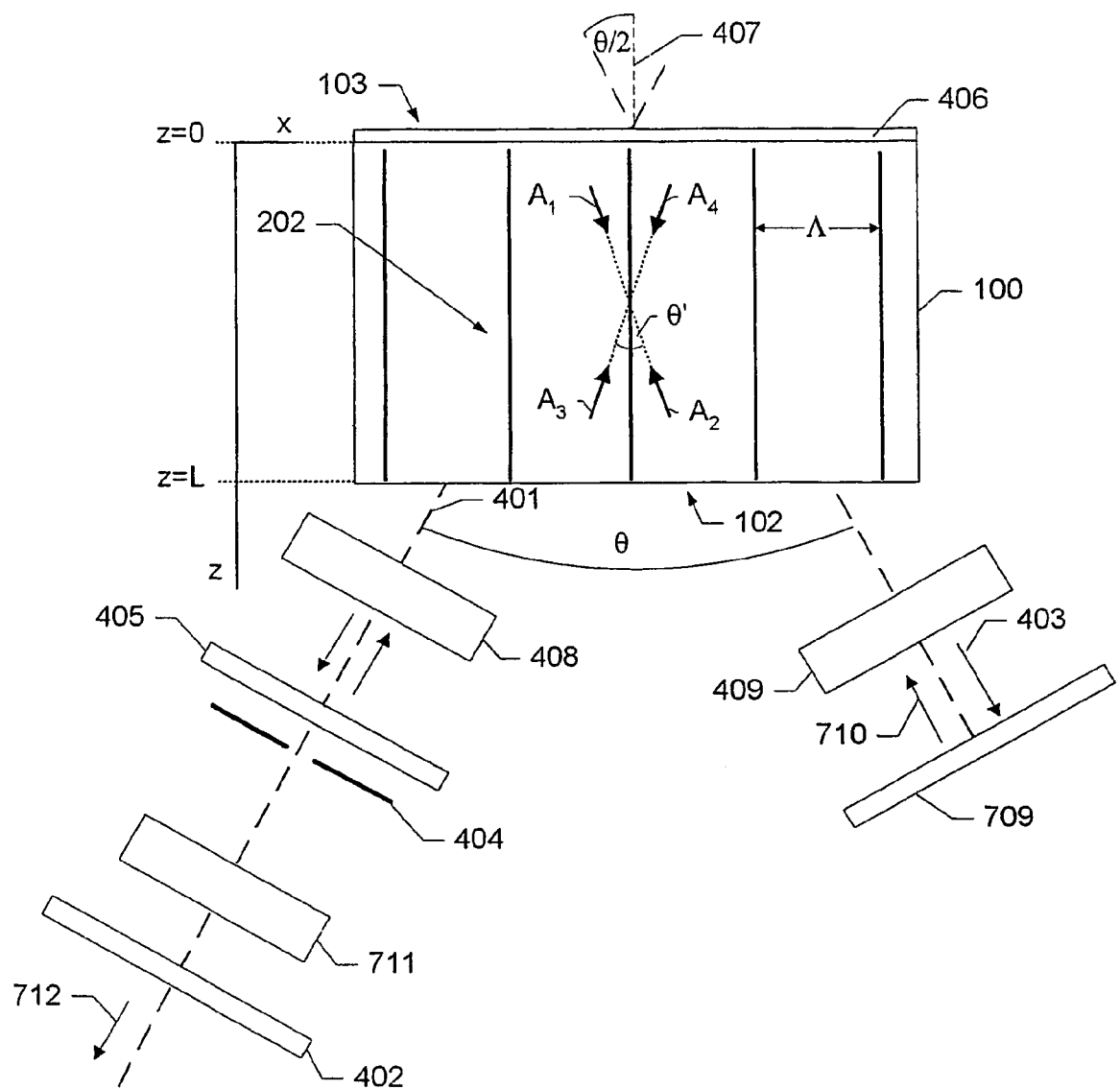
FIG. 7 schematically shows a laser system comprising a frequency doubler according to a sixth embodiment of the invention.

FIG. 7 schematically shows a laser system comprising a frequency doubler according to a sixth embodiment of the invention. In FIG. 7, a frequency doubler 711 is added to the system according to FIG. 4b. The frequency doubler is inserted in the cavity created by the mirror 402 and the four-wave mixing process in the diode amplifier 100. The frequency doubler 711 may comprise a nonlinear etalon including a frequency-doubling crystal with highly-reflective coatings on each of the end faces, e.g. with R>0.9. In one embodiment, the reflectivity of at least one of the faces may depend on the wavelength, e.g. a reflectivity of substantially 100% for the wavelength of the diode amplifier, such as $\lambda$=800 nm, and a low reflectivity, preferably substantially zero, for the wavelength of the frequency-doubled beam, i.e. in the above example $\lambda$=400 nm. The beam inside the cavity defined by the mirror 402 and the four-wave mixing process in the diode amplifier 100 is highly collimated and has a narrow bandwidth due to the selectivity of the four-wave mixing gratings 202, thereby providing a particularly well-suited source for frequency doubling. In order to increase the intensity inside the crystal a high reflectivity mirror 709 is placed in the output path. Hence, according to this embodiment, the beam 403 is reflected back into the amplifier diode 100 as beam 710 for further amplification, thereby increasing the intensity in the cavity defined by the mirror 402 and the four-wave mixing process in the diode amplifier 100 and, thus, providing a high power beam with good spatial and temporal coherence as an input to the frequency doubler 711. According to this embodiment, an output beam 712 is coupled out from the mirror 402. For example, the mirror 402 may provide a higher reflectivity for the wavelength of the laser diode than for the wavelength of the frequency doubled component, e.g. a reflectivity of substantially 100% for $\lambda$=800 nm and a low reflectivity, preferably substantially zero, for $\lambda$=400 nm.

It is understood that the mirror 402 may be replaced by another reflective member such as a grating. Furthermore, the mirror 402 may be replaced by one of the faces of the frequency doubler having a reflectivity which depends on the wavelength as described above.

It is further understood that other means for output coupling the frequency doubled beam may be provided. For example a grating may be used to couple out the frequency-doubled light beam. For example, a grating may be inserted in the light path of the frequency-doubled beam. The angle of reflection by the grating is different for the frequency doubled beam and the beam emitted by the laser diode due to different wavelengths of the beams.

It is further noted that a system comprising a frequency doubler may be implemented in different ways. For example, the frequency filter 405 and the frequency doubler 711 may be incorporated in one component. Alternatively, the frequency filter may be omitted due to the frequency selectivity of the four-wave mixing process in the diode amplifier.

FIGS. 8*a*-*d* illustrate measured intensity profiles of a laser system according to FIG. 4*a*.

Figure 8A:
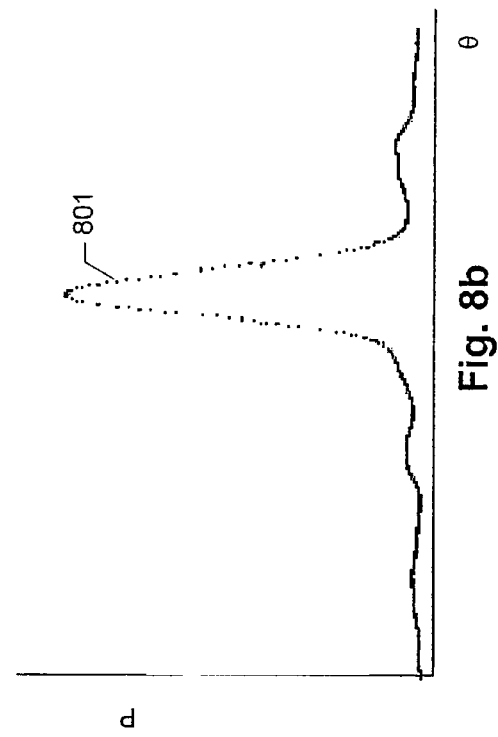
Figure 8B:
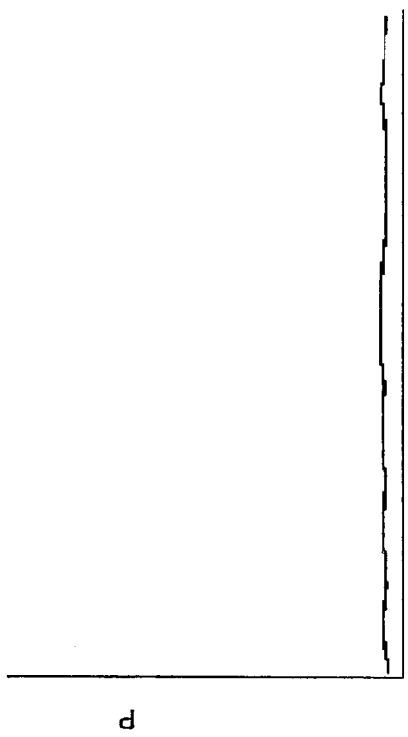
Figure 8C:
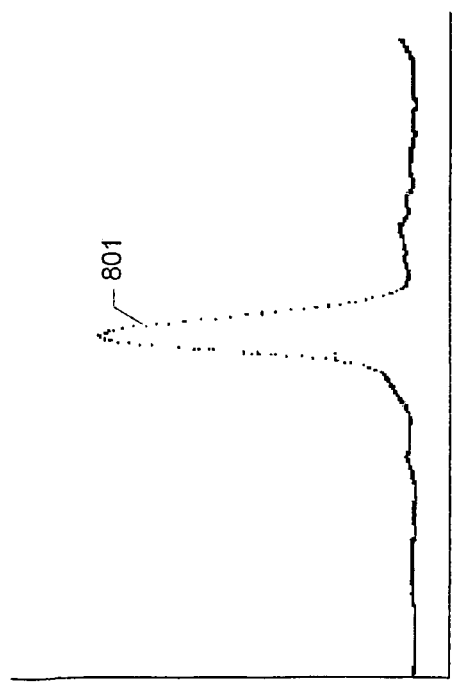
Figure 8D:
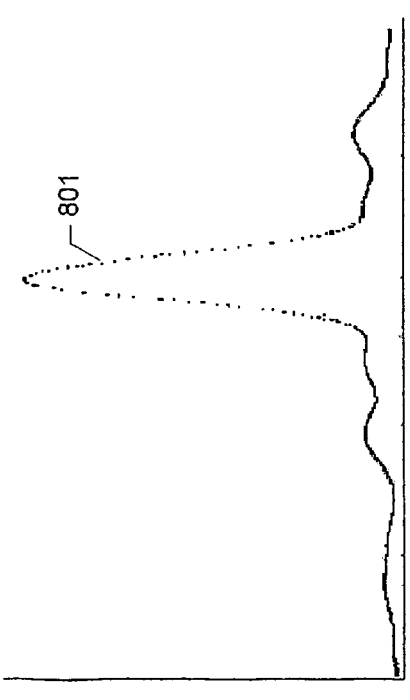

The intensity profiles of FIGS. 8*a*-*c* have been measured using a configuration as shown in FIG. 4*a*, where the laser diode array 100 is a GaAlAs gain-guided device with a 200 μm wide gain junction. The laser diode array was temperature controlled by a peltier element (not shown in FIG. 4*a*). The back facet 103 was provided with a coating 406 with a reflectivity of more than 0.99 and the output facet 102 of the laser diode was coated with an antireflection coating with reflectivity less than 0.1%. The laser light was coupled out of the diode by a lens system 409 comprising a lens with focal length of 4.5 mm and a numerical aperture of 0.55 and two cylindrical lenses. All lenses have had a broadband anti-reflection coating (R<1%) in order to minimize the loss. The lens systems 408 and 409 were implemented as a single lens system, since the angle $\theta$ is small. The mirror 402 was a dielectric coated mirror with a reflectivity R>0.999. After adjustment of the mirror an oscillating beam was observed at the mirror. In order to maintain this oscillating beam in a fundamental spatial mode at high power levels, an aperture was placed around the oscillating beam. FIGS. 8*a*-*d* show the angular intensity profile of the output beam 403, i.e. the intensity as a function of the angle $\theta$, both measured in arbitrary units. The intensity profiles of FIGS. 8*a*-*c* are measure with different pumping levels: In FIG. 8*a*, the pump current is I=0.95 A, in FIG. 8*b* the pump current is I=1.23 A, and in FIG. 8*c* the pump current is I=1.40 A. FIGS. 8*a*-*c* clearly show a dominant peak 801 and diffraction patterns at both sides of the peak due to the diffraction in the induced four-wave mixing grating. In FIG. 8*c* the output power is emitted centered around an angle $\theta$=6.9° and the output power is 620 mW. The full width half maximum of the central peak 801 in FIG. 8*c* is 0.61°. FIG. 8*d* shows the measured intensity profile of the above configuration where the light path between the mirror 402 and the laser diode 100 was blocked. The pump current in FIG. 8*d* was 1.40 A. Thus, FIG. 8*d* clearly shows that substantially no signal is observed when the mirror 402 is blocked, i.e. when the induction of gain and refractive index gratings in the diode amplifier is prevented.

It is noted that the position of the peak 801 in FIGS. 8*a*-*c* is different due to the fact that the angle depends on the gain as mentioned above.

It is understood that alternative embodiments may be provided within the scope of the invention, e.g. combinations of the above embodiments. For example, a monolithic embodiment where the passive reflective members are permanently embedded gratings may be provided in a configuration corresponding to FIG. 2*a*, i.e. with two gratings parallel to each other and placed close to opposite facets of the diode, thereby forming a laser cavity generating the pump beams. In this embodiment, a third grating which is tilted relative to the end facets may provide the nonnormal feedback beam $A_3$.

Furthermore, the invention has mainly been described in connection with broad area lasers. However, it is understood that the invention may be applied to other laser systems that have a broad gain area such as Nd-YAG lasers.

It is further noted that, due to the angle- and wavelength selectivity of the four-wave mixing grating, an output beam with high spatial and temporal coherence is produced, even without spatial and temporal filters, since the four-wave mixing gratings are automatically optimised to have high diffraction efficiency and selectivity due to feedback from the mirrors. However, as described above, in some embodiments the spatial and frequency filters may be used to further optimise the efficiency of the laser system. Both the spatial filter and the frequency filter enhance the diffraction efficiency, wavelength selectivity, and angle selectivity of the grating. Due to the Bragg selectivity of the grating a given mode is selected and at the same time other modes are effectively suppressed.

Furthermore, alternatively to inducing a single dynamic grating, multiple gratings may be induced and/or gratings may be induced due to a mixing process involving more than four laser beams or less than four laser beams.

It is further understood that a high-power laser system according to the invention may be applied in a large number of fields, for example lasers for medical use, in the graphical industry, for laser welding or cutting, in optical communications systems, e.g. as pump lasers for active waveguide lasers.

The invention claimed is:

1. A diode laser system comprising
   a diode amplifier including an amplifying medium for amplifying a number of spatial modes of a spatial light distribution; and
   a number of passive reflective members forming a laser cavity including at least a part of the amplifying medium, each of the passive reflective members being adapted, during operation, to reflect light at least partially into the amplifying medium;
   wherein at least a first and a second one of the number of passive reflective members are non-parallel to each other causing at least respective first and second light beams to propagate in corresponding first and second directions through the amplifying medium, the first and second directions defining a predetermined angle between them and causing the first and second light beams to induce, during operation, a dynamic gain and refractive index grating in the amplifying medium;
   and wherein the predetermined angle is selected large enough to cause the dynamic gain and refractive index grating to selectively diffract one of said spatial modes and suppressing at least a part of the remaining spatial modes of said spatial light distribution; and wherein the predetermined angle is selected small enough to cause the dynamic gain and refractive index grating to have a fringe spacing larger than the characteristic diffusion length of the amplifying medium.

2. A diode laser system according to claim 1, wherein the amplifying medium has a predetermined carrier lifetime and a predetermined ambipolar diffusivity, and the laser light has a predetermined vacuum wavelength; and the predetermined angle is selected to be smaller than a maximum angle given by said vacuum wavelength divided by $2\pi$ times the square root of the predetermined carrier lifetime times the ambipolar diffusivity.

3. A diode laser system according to claim 1 or 2, wherein the amplifying medium has a predetermined refractive index n, the laser light has a predetermined vacuum wavelength $\lambda$, and the diode amplifier comprises two end facets on opposite sides of the diode amplifier, the end facets being spaced apart by a distance L; and said predetermined angle is selected to be larger than a minimum angle $\theta_{crit}$ determined according to $$\theta_{crit} = \sqrt{\frac{2n\lambda}{L}}.$$

4. A diode laser system according to claim 1, wherein the amplifying medium has a predetermined refractive index, the laser light has a predetermined vacuum wavelength, the induced gain and refractive index grating has a predetermined fringe spacing, and the diode amplifier comprises two end facets on opposite sides of the diode amplifier, the end facets being spaced apart by a distance which is larger than said refractive index times said fringe spacing squared and divided by said vacuum wavelength, preferably larger than twice said refractive index times said fringe spacing squared and divided by said vacuum wavelength.

5. A diode laser system according to claim 1, wherein the diode amplifier comprises a GaAlAs laser diode with end facets being spaced apart by a distance between 0.5 mm and 4 mm and corresponding to a wavelength of 810 nm; and the angle is selected to be between 1 and 10 degrees.

6. A diode laser system according to claim 1, wherein the diode amplifier comprises two end facets on opposite sides of the diode amplifier, at least a first one of the end facets including a light emitting stripe having a stripe width which is larger than 200 µm.

7. A diode laser system according to claim 6, wherein the stripe width of the first end facet is between 200 µm and 1000 µm.

8. A diode laser system according to claim 1, wherein the gain and refractive index grating is induced by a four-wave mixing process.

9. A diode laser system according to claim 1, wherein at least a first one of said number of reflective members is positioned outside the diode amplifier; and the laser system further comprises a spatial filter positioned between the first reflective member and the diode amplifier.

10. A diode laser system according to claim 9, wherein the spatial filter is adapted to suppress a part of the spatial modes of a corresponding one of the light beams of the first and second pairs of light beams.

11. A diode laser system according claim 1, wherein at least a first one of said number of reflective members is positioned outside the diode amplifier; and the laser system further comprises a frequency filter positioned between the first reflective member and the diode amplifier, the frequency filter reducing the spectral bandwidth of a corresponding one of the light beams of the first and second pairs of light beams.

12. A diode laser system according to claim 1, wherein at least one of the passive reflective members is a permanent grating embedded in the diode amplifier.

13. A diode laser system according to claim 1, wherein
   the diode amplifier comprises a front facet and a rear facet on opposite sides of the diode amplifier, each of the facets being coated with an antireflection coating;
   a first and a second one of the reflective members are positioned on opposite sides of the amplifying medium corresponding to the rear and front facets, the first and second reflective members forming the laser cavity and generating a first pair of counter-propagating light beams; and
   a third one of the reflective members is positioned on one side of the amplifying medium corresponding to the front facet, the third reflective member causing one of a second pair of counter-propagating light beams to be reflected back into the amplifying medium, the second pair of counter-propagating light beams propagating at a predetermined incident angle relative to the front and rear facets outside the diode amplifier.

14. A diode laser system according to claim 1, wherein
   the diode amplifier comprises a front facet and a rear facet on opposite sides of the diode amplifier, the front facet being coated with a low-reflectivity coating;
   a first one of the reflective members is positioned on one side of the amplifying medium corresponding to the front facet, the first reflective member causing one of a first pair of counter-propagating light beams to be reflected back into the amplifying medium at a predetermined incident angle relative to the front and rear facets;
   a second one of the number of reflective members is the rear facet of the diode amplifier, the rear facet reflecting an incident one of the first pair of counter-propagating light beams, the reflected light beam forming an output beam of the laser system being emitted at an emission angle corresponding to the incident angle.

15. A diode laser system according to claim 14, wherein the first reflective member is the front facet of the diode amplifier, the front facet being tilted by a predetermined tilt angle relative to the rear facet, and the front facet being coated with a coating providing a higher reflection coefficient for a light beam with an incident angle of zero degrees relative to an axis normal to the front facet than a reflection coefficient of a light beam with an incident angle corresponding to the tilt angle.

16. A diode laser system according to claim 15, wherein the system further comprises a third reflective member adapted to reflect said output beam back in the diode amplifier; and a frequency conversion member placed between the first reflective member and the diode amplifier.

17. A diode laser system according to claim 1, wherein the system further comprises a frequency conversion member.

18. A method of aligning a diode laser system, the diode laser system comprising
   a diode amplifier including an amplifying medium for amplifying a number of spatial modes of a spatial light distribution; and
   a number of passive reflective members forming a laser cavity including at least a part of the amplifying medium, each of the passive reflective members being adapted, during operation, to reflect light at least partially into the amplifying medium;
the method comprising the step of aligning at least a first and a second one of the number of passive reflective members to cause at least respective first and second light beams to propagate in corresponding first and second directions through the amplifying medium, the first and second directions defining a predetermined angle between them, and to cause the first and second light beams to induce a dynamic gain and refractive index grating in the amplifying medium; wherein the step of aligning at least the first and the second passive reflective members comprises selecting the predetermined angle large enough to cause the dynamic gain and refractive index grating to selectively diffract one of said spatial modes and suppressing at least a part of the remaining spatial modes of said spatial light distribution, and selecting the predetermined angle small enough to cause the dynamic gain and refractive index grating to have a fringe spacing which is larger than the characteristic diffusion length of the amplifying medium.

19. A diode laser system according to claim 5, wherein the angle is between 4 and 7 degrees.

20. A diode laser system according to claim 19, wherein the angle is between 4.2 and 6.5 degrees.

21. A diode laser system according to claim 6, wherein the stripe width is larger than 300 µm.

22. A diode laser system according to claim 21, wherein the stripe width is larger than 500 µm.

23. A diode laser system according to claim 7, wherein the stripe width is between 300 µm and 700 µm.

* * * * *